United States Patent
Kim et al.

(10) Patent No.: US 6,329,237 B1
(45) Date of Patent: Dec. 11, 2001

(54) METHOD OF MANUFACTURING A CAPACITOR IN A SEMICONDUCTOR DEVICE USING A HIGH DIELECTRIC TANTALUM OXIDE OR BARIUM STRONTIUM TITANATE MATERIAL THAT IS TREATED IN AN OZONE PLASMA

(75) Inventors: Kyong Min Kim; Chan Lim, both of Kyungki-Do; Kil Ho Lee, Seoul; Ki Seon Park, Kyungki-Do, all of (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/466,896

(22) Filed: Dec. 20, 1999

(30) Foreign Application Priority Data

Dec. 24, 1998 (KR) .................................................. 98-58594

(51) Int. Cl.⁷ ................................................. H01L 21/8242
(52) U.S. Cl. ..................... 438/240; 438/386; 438/393; 438/396; 438/250
(58) Field of Search .................................... 438/240, 393, 438/250, 239, 389, 396, 243, 253

(56) References Cited

U.S. PATENT DOCUMENTS

| | | |
|---|---|---|
| 5,352,623 | * 10/1994 | Kamiyama . |
| 5,380,673 | * 1/1995 | Yang et al. . |
| 5,468,687 | * 11/1995 | Carl et al. . |
| 5,508,221 | * 4/1996 | Kamiyama . |
| 5,726,083 | * 3/1998 | Takaishi . |
| 5,834,357 | * 11/1998 | Kang . |
| 5,837,593 | * 11/1998 | Park et al. . |
| 5,854,106 | * 12/1998 | Wu . |
| 5,874,334 | * 2/1999 | Jenq et al. . |
| 5,895,250 | * 4/1999 | Wu . |
| 5,913,129 | * 6/1999 | Wu et al. . |
| 5,973,911 | * 10/1999 | Nishioka . |
| 5,985,730 | * 11/1999 | Lim . |
| 6,150,209 | * 11/2000 | Sun et al. . |
| 6,165,834 | * 12/2000 | Agarwal et al. . |
| 6,200,847 | * 3/2001 | Kishiro . |
| 6,235,572 | * 5/2001 | Kunitomo et al. . |

FOREIGN PATENT DOCUMENTS

| | | |
|---|---|---|
| 9-219501 | * 8/1997 | (JP) . |
| 10-256081 | * 9/1998 | (JP) . |

OTHER PUBLICATIONS

F.–X. Jiang and S. K. Kurinec, "Tantalum Oxide Thin Films for Microelectronic Applications," IEEE Proceedings of the Eleventh Biennial University/Government/Industry Microelectronics Symposium, May 1995, pp. 101–104.*

* cited by examiner

Primary Examiner—Charles Bowers
Assistant Examiner—Stephen W. Smoot
(74) Attorney, Agent, or Firm—Pennie & Edmonds LLP

(57) ABSTRACT

There is disclosed a method of making a high dielectric capacitor of a semiconductor device using $Ta_2O_5$, BST $((Ba_{1-x}Sr_x)TiO_3)$ etc. of a high dielectric characteristic as a capacitor dielectric film in a very high integrated memory device. The present invention has its object to provide a method of manufacturing a high dielectric capacitor of a semiconductor device, which can effectively remove carbon contained within the thin film after deposition of the BST film and defects of oxygen depletion caused upon deposition of the thin film and which can also remove carbon contained within the thin film after deposition of the tantalum oxide film and defects of oxygen depletion caused upon deposition of the thin film, without further difficult processes or without any deterioration of the electrical characteristic of the capacitor. It employs the technology which is able to effectively removing defects of carbon and oxygen depletion within the thin film, by forming a plasma $O_3$ gas having a good reactivity and by processing the plasma for the BST thin film and tantalum oxide film. Thus, it can extend the lifetime of the activated oxygen of oxygen, which had been a problem in processing a conventional $UV-O_3$, by means of plasma process using $O_3$ gas. Therefore, it can effectively remove defects of carbon and oxygen within the BST thin film and tantalum oxide film without complicating the process or deteriorating the electrical characteristic of the capacitor. The present invention also proposes a detailed process condition, which can optimize the plasma process using $O_3$ gas.

18 Claims, 2 Drawing Sheets

METHOD OF MANUFACTURING A CAPACITOR IN A SEMICONDUCTOR DEVICE USING A HIGH DIELECTRIC TANTALUM OXIDE OR BARIUM STRONTIUM TITANATE MATERIAL THAT IS TREATED IN AN OZONE PLASMA

FIELD OF THE INVENTION

1. Field of the Invention

The present invention relates to a semiconductor technology. In particular, the present invention relates to a method of making a high dielectric capacitor in a semiconductor device, in which $Ta_2O_5$, $BST((Ba_{1-x}Sr_x)TiO_3)$ etc. having a high dielectric characteristic are used as capacitor dielectric films in a very high integrated memory device.

2. Description of the Prior Art

As the integration degree of a semiconductor device including DRAMs becomes higher, securing a sufficient static capacitance of a capacitor becomes problematic. As one of the solutions to solve this problem, a lot of efforts have been made to increase the surface area of the charge storage electrode, that is the underlying electrode of the capacitor. However, due to decrease of a process margin accompanied by the higher integration, there has been a limitation in increasing the surface area of the charge storage electrode.

In order to overcome this limitation, interest has been increased to technology for manufacturing a high dielectric capacitor using high dielectric materials such as tantalum oxide films, BST etc., which have a high dielectric characteristic, as capacitor dielectric films. The technology employs the principle in which the static capacitance of a capacitor is proportional to the dielectric rate.

The process of manufacturing the dielectric capacitor is normally similar to that of the NO (Nitride/Oxide) capacitor. However, it additionally includes technology of forming a thin film using tantalum oxide film, BST etc. having high dielectric materials, and process of pre • post processing technology etc. for preventing deterioration of an electric characteristic in the capacitor.

In case of using the BST thin film as the capacitor dielectric film, it uses $Ba(C_{11}H_{19}O_2)_2$, $Sr(C_{11}H_{19}O_2)_2$, and $Ti(C_3H_7O)_2$. Therefore, it may include large amount of carbon within the thin film and also may cause the defects of oxygen depletion upon deposition of the thin film. Thus, it will increase a leak current to deteriorate the electric characteristic of the capacitor. Even though, any post processing technology to overcome these problems has not been made so far.

Also, in case of using the tantalum oxide film as the capacitor dielectric film, there have problems similar to those occurring when using BST thin films. It has usually performed an UV-$O_3$ process, a plasma process such as $O_2$ or $N_2O$ gases. etc., as subsequent processes for removing carbon from the tantalum oxide film or solving the oxygen depletion.

In case of UV-$O_3$ process, it must be performed under a semi-constant pressure or a constant pressure state in order to keep oxygen activated. Thus, at high pressure, as the average freedom pass of Oxidant is short, so the lifetime of Oxidant is short. Thus, in order to overcome this problem, the distance between the UV-lamp and the wafer must be extremely narrowed and also controlled with extra care, thus causing many limitations in process. Additionally, in case of using the plasma process such as $O_2$ or $N_2O$ gases, since $O_2$ gas become relatively less activated compared to $N_2O$ gas, it has a low effect of processing $Ta_2O_5$ thin film compared to $N_2O$ gas. Also, if the plasma excites N2O gas, it will be decomposed to create oxygen ions or nitrogen ions, which then will eliminate the removal of carbon within the tantalum oxide film and the defects of oxygen depletion. However, nitrogen ions may damage $Ta_2O_5$ thin films, thus it may cause the problem of deteriorating an electrical characteristic of the device.

SUMMARY OF THE INVENTION

It is an object of the present invention to solve the problems involved in the prior art, and to provide a method of manufacturing a high dielectric capacitor of a semiconductor device, which can effectively remove carbon contained within the thin film after deposition of the BST film and defects of oxygen depletion caused upon deposition of the thin film.

Further, another object of the present invention is to provide a method of manufacturing a high dielectric capacitor of a semiconductor device, which can remove carbon contained within the thin film after deposition of the tantalum oxide film and defects of oxygen depletion caused upon deposition of the thin film, without further difficult processes or without any deterioration of the electrical characteristic of the capacitor.

The present invention employs the technology capable of effectively removing defects of carbon and oxygen depletion within the thin film, by forming a plasma $O_3$ gas having a good reactivity and by processing the plasma for the BST thin film and tantalum oxide film. It can extend the lifetime of the activated oxygen of oxygen, which had been a problem in processing a conventional UV-$O_3$, by means of plasma process using $O_3$ gas. Thus, it can effectively remove defects of carbon and oxygen within the BST thin film and tantalum oxide film without complicating the process or deteriorating the electrical characteristic of the capacitor. The present invention also proposes a detailed process condition, which can optimize the plasma process using $O_3$ gas.

In order to accomplish the above object, a method of manufacturing a capacitor in a semiconductor device using a high dielectric tantalum oxide that is treated in an ozone plasma according to the present invention comprises a first step of forming a conductive film for an underlying electrode on a given underlying layer; a second step of forming a tantalum oxide film on the conductive film for the underlying electrode; a third step of performing a plasma process using ozone gas to remove defects and to crystallize the tantalum oxide film; and a fourth step of forming a conductive film for an upper electrode on the tantalum oxide film.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENT

FIGS. 1a through 1d show the processes of manufacturing a tantalum oxide film capacitor according to one embodiment of the present invention.

Figure 1A:
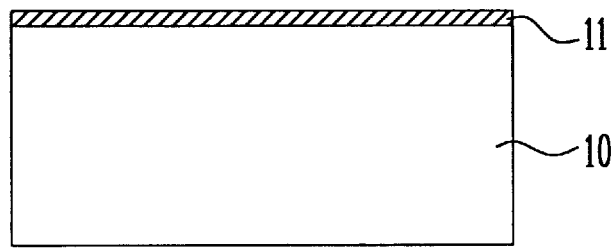
FIGS. 1a through 1d show processes of making a tantalum oxide film capacitor according to one embodiment of the present invention.

First, as shown in FIG. 1a, an underlying polysilicon electrode 10 of a capacitor is formed on a substrate to which a given underlying process was finished. Then, a natural oxide film (not shown), which is formed on the surface of the underlying polysilicon electrode 10, is removed using HF or BOB (Buffered Oxide Etchant) solution. Next, the surface of the underlying polysilicon electrode 10 is nitrided by performing a rapid thermal nitridation (RTN) process at the temperature of 800 through 950° C. At this time, the nitridation process for the underlying electrode 10 is to prevent the thickness of the effective oxide film of the capacitor from increasing since the surface of the underlying polysilicon electrode 10 is oxidized under a high temperature of oxygen atmosphere when and after $Ta_2O_3$ is deposited. In the drawing, reference numeral '11' indicates the surface of the underlying polysilicon nitrided electrode.

Figure 1B:
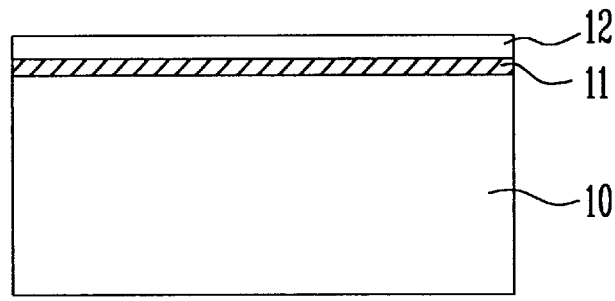

Next, as shown in FIG. 1b, ethoxy tantalum ($Ta(OC_2H_5)_5$) of 0.001 cc through 2 cc is vaporized at the vaporizer at which the temperature of 170° C. through 190° C. is maintained. $O_2$ gas of 10 sccm through 1000 sccm is used as a reactive gas and the pressure within the reactive furnace is maintained at 0.1 torr through 1.2 torr. Then, tantalum oxide film ($Ta_2O_5$) 12 is deposited on the wafer that was heated at 350° C. through 450° C.

Figure 1C:
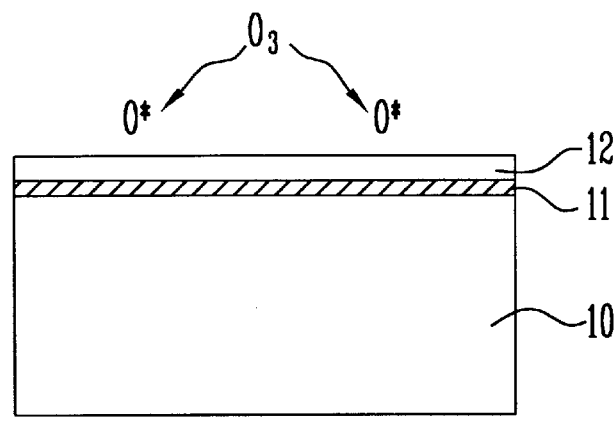

Thereafter, as shown in FIG. 1c, the tantalum oxide film 12 is plasma-processed using $O_3$ gas by a subsequent thermal process. Then, the plasma process using $O_3$ gas may be performed as the following conditions:

A. The pressure within the chamber is maintained 10 torr through 900 torr.
B. The temperature of the sub heater below the wafer is maintained at 100° C. through 500° C.
C. The power of the RF (radio frequency) is set to 50 Watt through 400 Watt.
D. Upon supplying the power, the sub heater is connected to the ground and the showerhead is connected to an electrode.
E. The time of processing $O_3$ is set to 1 through 20 minutes.
F. The concentration of $O_3$ is set to 10000 ppm through 200000 ppm.

Figure 1D:
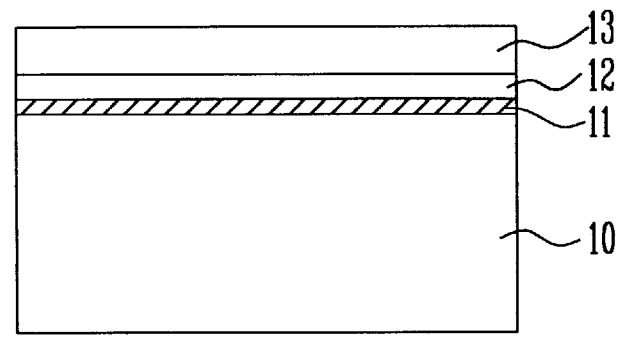

Next, a thermal process is performed under $O_2$ or $N_2O$ gas atmosphere at the temperature of 700 through 900° C., thus crystallizing the tantalum oxide film 12. As shown in FIG. 1d, a TiN film 13 for an upper electrode is deposited on the tantalum oxide film 12. Optionally, during the previous plasma process, the plasma process may be performed under the condition in which crystallization of tantalum oxide film 12 occurs, for example, the condition in which the temperature of the sub heater is increased to 650° C. through 750° C., and the above additional crystallization thermal process may be omitted.

Figure 2A:
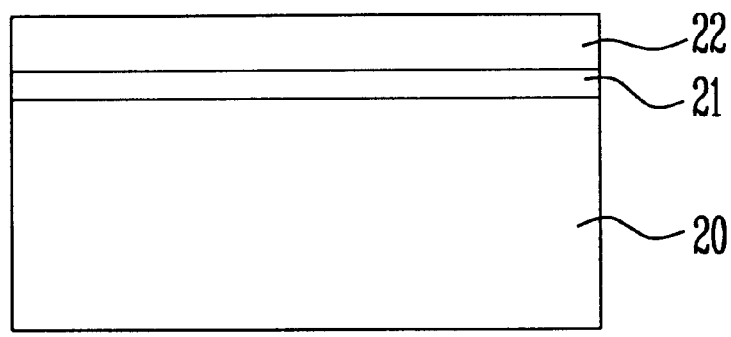
FIGS. 2a through 2c show processes of making a BST capacitor according to another embodiment of the present invention.
Figure 2B:
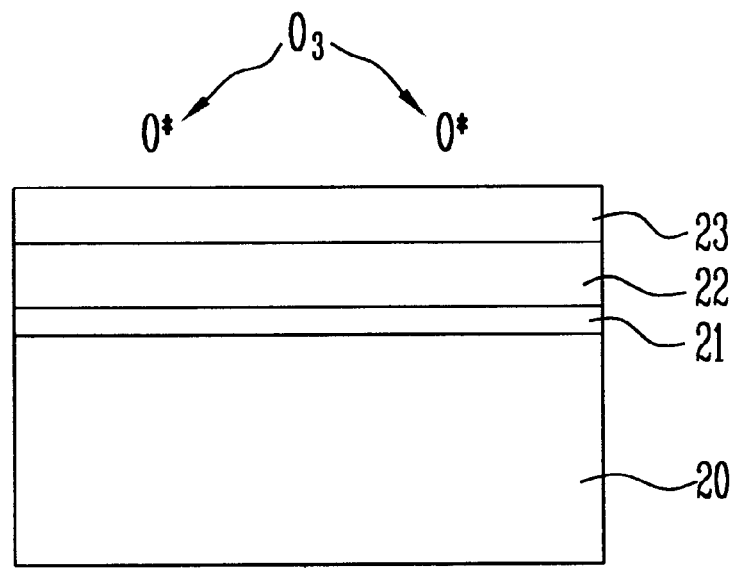
Figure 2C:
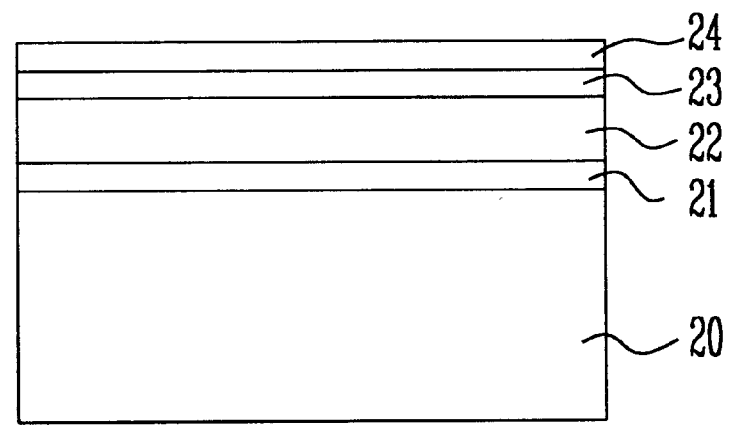

FIGS. 2a through 2c show processes of making a BST capacitor according to another embodiment of the present invention.

First, an interlayer insulating layer is deposited on a substrate to which a given underlying process was finished and the insulating layer is then selectively etched to form a contact hole. Then, as shown in FIG. 2a, a polysilicon plug 20 is formed on it. The figure below is simplified to show its major parts. Next, a natural oxide film formed on surface of the polysilicon plug is removed and Ti/TiN film 21 is deposited on the entire surface at the thickness of 100 Å through 500 Å at 0.2 torr through 10 torr at a room temperature through 700° C. Subsequently, a Pt film 22 of an underlying electrode material is deposited on the Ti/TiN film 21 at the thickness of 1000 Å through 2000 Å at a room temperature through 500° C.

Thereafter, as shown in FIG. 2b, a BST film 23 is deposited at 0.1 torr through 2 torr at the temperature of 600° C. through 800° C. Then, the BST film 23 is plasma-processed using $O_3$ gas by a subsequent thermal process. Then, the plasma process using $O_3$ gas may be performed as the same conditions explained above.

Next, as shown in FIG. 2c, the Pt film 24 is deposited at thickness of 1000 Å through 2000 Å at the room temperature through 500° C.

While the present invention has been described and illustrated herein with reference to the preferred embodiment thereof, it will be understood by those skilled in the art that various changes in form and details may be made therein without departing from the spirit and scope of the invention.

For example, though the above embodiment has explained the process of manufacturing a simple stack-type capacitor as one example, the present invention can be applied to a cylinder structure, a pin structure and a complicated structure to which semi-spherical silicon is applied.

In addition, though the above embodiment did not explain the process of patterning the under and upper electrodes, the present invention can be applied without regard to the order of the process of patterning the capacitor.

From the foregoing, the present invention can effectively remove the defects of carbon and oxygen depletion within the thin film, by means of plasma process for the BST thin film and the tantalum oxide film using $O_3$ gas. Therefore, it can improve the film quality of the high dielectric thin film, improve the characteristic of leak current and thus improve the electrical characteristic of the capacitor. Also, if the present invention is applied to the tantalum oxide film, it can meet the stoichiometry of Ta: O=1:2.5 in tantalum oxide film $Ta_2O_5$).

What is claimed is:

1. A method of manufacturing a capacitor in a semiconductor device using a high dielectric tantalum oxide that is treated in an ozone plasma, comprising:
    a first step of forming a conductive film for an underlying electrode on a given underlying layer;
    a second step of forming a tantalum oxide film on the conductive film for the underlying electrode;
    a third step of performing a plasma process using ozone gas to remove defects and to crystallize the tantalum oxide film; and
    a fourth step of forming a conductive film for an upper electrode on the tantalum oxide film.

2. The method of manufacturing a capacitor in a semiconductor device using a high dielectric tantalum oxide that is treated in an ozone plasma as claimed in claim 1, wherein the conductive film for the underlying electrode is polysilicon film.

3. The method of manufacturing a capacitor in a semiconductor device using a high dielectric tantalum oxide that is treated in an ozone plasma as claimed in claim 1, wherein after performing said first step, further comprising a fifth step of nitriding some of the conductive film for the underlying electrode.

4. The method of manufacturing a capacitor in a semiconductor device using a high dielectric tantalum oxide that is treated in an ozone plasma as claimed in claim 1, wherein said plasma process is performed under a sub heater condition having the pressure of 10 torr through 900 torr and the temperature of 100° C. through 750° C.

5. The method of manufacturing a capacitor in a semiconductor device using a high dielectric tantalum oxide that is treated in an ozone plasma as claimed in claim 4, wherein said plasma process is performed using an RF power of 50 Watt through 400 Watt.

6. The method of manufacturing a capacitor in a semiconductor device using a high dielectric tantalum oxide that is treated in an ozone plasma as claimed in claim 4, wherein said plasma process is performed for a duration of 1 minute through 20 minutes.

7. The method of manufacturing a capacitor in a semiconductor device using a high dielectric tantalum oxide that is treated in an ozone plasma as claimed in claim 4, wherein said plasma process uses ozone gas of 10000 ppm through 200000 ppm.

8. A method of manufacturing a capacitor in a semiconductor device comprising:

forming a first conductive film for an underlying electrode on a substrate;

forming a tantalum oxide film on the conductive film for the underlying electrode;

plasma-processing the tantalum oxide film with ozone gas to thereby crystallize said tantalum oxide film; and forming a conductive film for an upper electrode on the crystallized tantalum oxide film.

9. The method according to claim 8, wherein the conductive film for the underlying electrode is polysilicon film.

10. The method according to claim 8, comprising nitriding some of the conductive film for the underlying electrode, after forming the first conductive film.

11. The method according to claim 8, wherein said plasma processing uses an RF power of 50 Watts through 400 Watts.

12. The method according to claim 8, wherein said plasma processing is performed for a duration of 1 minute through 20 minutes.

13. The method according to claim 8, wherein said plasma processing uses ozone gas of 10,000 ppm through 200,000 ppm.

14. The method according to claim 8, wherein said plasma processing is performed under a sub heater condition having the pressure of 10 torr through 900 torr and the temperature of 100° C. through 750° C.

15. The method according to claim 14, wherein said plasma processing uses an RF power of 50 Watts through 400 Watts.

16. The method according to claim 15, wherein said plasma processing is performed for a duration of 1 minute through 20 minutes.

17. The method according to claim 16, wherein said plasma processing uses ozone gas of 10,000 ppm through 200,000 ppm.

18. A method of manufacturing a capacitor in a semiconductor device comprising:

forming a first conductive film for an underlying electrode on a substrate;

forming a barium strontium titanate (BST) film on the conductive film for the underlying electrode;

plasma-processing the BST film with ozone gas; and forming a conductive film for an upper electrode on the BST film.

* * * * *